OSCILLATOR CIRCUIT WITH AUTOMATIC BIAS CONTROL

Filed Nov. 8, 1967

Inventors
Fred J. Conforti
Lyn F. Peterson
BY Mueller, Aichele & Rauner
Attys.

United States Patent Office 3,471,805
Patented Oct. 7, 1969

3,471,805
OSCILLATOR CIRCUIT WITH AUTOMATIC BIAS CONTROL

Fred J. Conforti, Wood Dale, and Lyn F. Peterson, Villa Park, Ill., assignors to Motorola, Inc., Franklin Park, Ill., a corporation of Illinois Filed Nov. 8, 1967, Ser. No. 681,518
Int. Cl. H03k 3/28
U.S. Cl. 331—113 12 Claims

ABSTRACT OF THE DISCLOSURE

The oscillator circuit includes a switching transistor having output electrodes which connect a load impedence to a DC supply voltage, with a feedback circuit coupling the load impedance to the transistor input electrode to provide an alternating current signal. A sensing device in series with the load impedance controls the value of a variable resistance in the bias circuit of the transistor to reduce the bias current for a decrease in the current flowing through the load impedance.

BACKGROUND OF THE INVENTION

A DC-to-DC inverter-regulator has been used to convert a battery voltage into a regulated DC voltage which remains constant in spite of current requirement variations in the particular electronic equipment supplied by the regulator. In two-way radios having a transmitter and a receiver, the load variations are particularly extreme because the operation alternates between a heavy load when the transmitter is used, a medium load when the receiver is used, and a light load when the radio is in standby.

Because of its very high efficiency, a switching type inverter is particularly useful where battery life is an important consideration. Such an inverter may take the form of an oscillator which converts the battery voltage into a pulsating signal. The signal is then rectified and applied to a regulator to provide the regulated voltage for the electronic equipment. The oscillator may include a saturating transformer and switching transistors which cooperate in a manner to provide the pulsating signal. Present day oscillators have the disadvantage that the transistors are supplied with the same magnitude of input or bias current whether the load current is high or low. In order to provide the necessary amplitude of the pulsating signal for the high load current condition, it is, of course, necessary to provide a substantial bias current to the transistors. It is, however, unnecessary that the same amount of bias current be supplied during the low load current condition. The effect of supplying a constant high value transistor input current on the overall efficiency of the inverter-regulator may be appreciated by considering that the transmitter and receiver each operate about 10% of the time whereas the radio is in a standby condition for the remaining 80% of the time. Thus while a substantial bias or input current is required for 20% of the time, the oscillator transistors are drawing this same substantial bias current for 80% of the time to appreciably detract from the overall efficiency.

SUMMARY OF THE INVENTION

It is, therefore, an object of this invention to provide a transistorized oscillator which converts a DC voltage into an AC signal, with a minimum transistor bias or input current being supplied during a condition where the current required by the oscillator load is small.

Another object of this invention is to provide a DC-to-DC inverter-regulator for a varying load with an improved overall efficiency.

Another object of this invention is to supply a reduced bias current to a pulsating signal oscillator when the load current decreases.

In brief, a load impedance is coupled to a DC voltage, such as that provided by a battery, in series with the output and common electrodes of an electron control device. More specifically, the circuit may comprise a pair of transistors which conduct on alternate half cycles. A feedback impedance is coupled to the load impedance and to the input electrode of the electron control device to develop an alternating current signal across the load impedance. A variable resistance network is coupled in series with the input and common electrodes to provide input current for the electron control device. A sensing device is coupled in series with the load impedance to provide a control voltage indicative of the current through the load. A circuit is coupled between the sensing device and the variable resistance network for controlling the resistance of the network and changing the input current in the electron control device in the same direction as changes on the magnitude of current flowing through the load impedance.

DETAILED DESCRIPTION OF THE PREFERRED EMBODIMENTS

Figure 1:
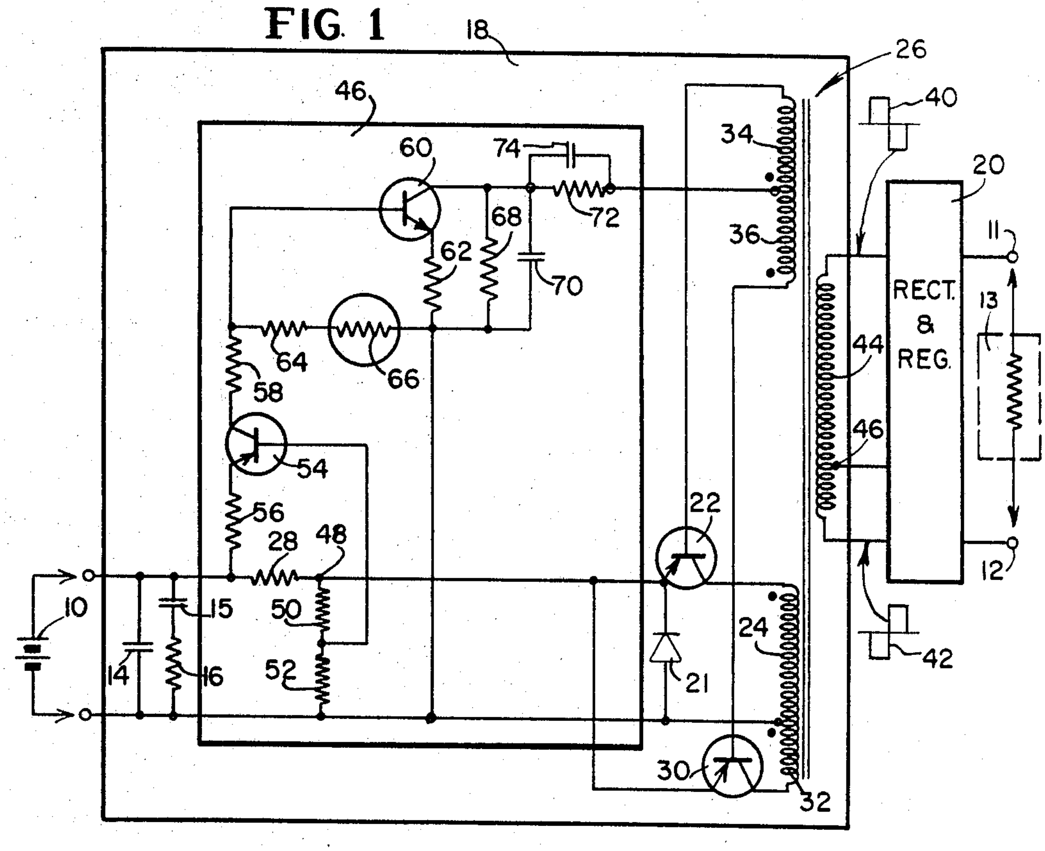
FIG. 1 illustrates a DC-to-DC inverter-regulator partially in block and partially in schematic constructed in accordance with the features of the invention.

Referring now to FIG. 1 of the drawing, the DC-to-DC inverter-regulator therein shown converts an unregulated voltage supplied by battery 10 into a regulated DC voltage between the terminals 11 and 12 for supplying a load 13. Filtering is provided by a capacitor 14 across the battery 10, and series connected capacitor 15 and resistor 16 also across the battery. The inverter-regulator includes an oscillator circuit 18 for developing an AC pulsating signal, and a rectifier and regulator circuit 20 for converting the signal into a regulated DC voltage.

Diode 21 protects the components of the regulator if the battery 10 is connected with the wrong polarity. When the battery is properly connected, diode 21 has no effect on the circuit whereas, if the battery is inserted with the wrong polarity, diode 21 becomes a short circuit to, for example, blow a fuse in series with the battery.

The oscillator circuit 18 includes at least one electron control device such as a PNP transistor 22, the collector and emitter electrodes of which are coupled in series with one primary winding 24 of a saturating transformer 26, the battery 10 and a sensing resistor 28. The oscillator 18 also includes a second PNP transistor 30 having collector and emitter electrodes coupled in series with a second primary winding 32, the battery 10 and the sensing resistor 28. The transformer 26 includes a pair of feedback windings 34 and 36 coupled to the bases of transistors 22 and 30, respectively. The windings 24 and 32, and the windings 34 and 36, may be formed by tapped coils as shown.

When the inverter-regulator is energized by connecting battery 10 thereto, because an unbalanced situation will exist in a practical circuit, current flows through one of the transistors 22 or 30 an instant before it flows through the other. Assuming that transistor 22 starts conducting first, current from the battery 10 flows through sensing resistor 28, the collector-emitter resistance of transistor 22 and through winding 24 in such a direction as to send the core material of transformer 26 towards positive saturation and thereby furnish a voltage at the top of winding 24 which increases in the positive direction. Due to the polarity of the windings represented by the respective location of the dots, this induces a voltage at the top of feedback winding 34 which increases in the negative direction to increase the bias of transistor 22 and thereby increase its conduction. As the core material continues to approach and finally reaches positive saturation, the induced voltage in winding 34 maintains the transistor 22 in a saturated state. Due to the polarity of the windings, the positively increasing voltage at the top of winding 24 induces a positively increasing voltage on the bottom of winding 36 which maintains transistor 30 nonconductive.

When the current in the first primary winding 24 has driven the core material of transformer 26 into positive saturation, the impedance of winding 24 is significantly reduced so that an increasing portion of the voltage from battery 10 appears across the sollector-emitter resistance of transistor 22 and less voltage appears across the winding 24. Thus a lesser voltage is induced in the feedback winding 34, which reduces the magnitude of the negative-going voltage on the base of the transistor 22. Consequently the emitter-collector impedance begins to increase and an avalanche effect is produced which rapidly decreases the current flowing through the winding 24. The voltage induced in the winding 34 by this flux collapse applies a voltage of an opposite polarity to the base of transistor 22 to bring the transistor's emitter-collector impedance to its highest value. The rates of voltage increase and decrease are quite rapid so as to produce a positive pulse at the top of winding 24.

As a result of the collapse in flux, an oppositely poled negative voltage is induced at the bottom of feedback winding 36 which is of a direction to turn on transistor 30. Now current flows from battery 10 through sensing resistor 28, the collector-emitter resistance of transistor 30 and the second primary winding 32 to thereby provide a positive voltage at the bottom of winding 32. This induces a voltage at the bottom of feedback winding 36 to maintain transistor 30 conductive and a voltage across feedback winding 34 to render transistor 22 nonconductive. The current conducted by transistor 30 drives the core in transformer 26 towards negative saturation. When the core material saturates in the negative direction, the flux collapses again and a reverse voltage is coupled back through feedback winding 36 to the base of transistor 30 to render the same non-conductive. A forward polarity voltage is coupled back to the feedback winding 34 to forward bias the base-emitter junction of transistor 22. Current begins to flow through the collector-emitter resistance of transistor 22 and primary winding 24, to begin a new cycle.

The alternate conduction of the transistors acts to produce oppositely phased pulsating signals 40 and 42 at opposite ends of the secondary winding 44 with respect to a tap 46. These signals are applied to the rectifier and regulator circuit 20 to produce a regulated DC voltage between terminals 11 and 12.

The load 13 may represent the receiver and the transmitter of a two-way radio. In the presence of a heavy load when the transmitter is operating, the inverter-regulator must supply a substantial current. The load is of medium magnitude and therefore less current is required when the receiver is operating and its audio stages are drawing power. However, when the receiver is operated in its standby mode, the power consuming audio stages are squelched or disabled and only low level stages are drawing current from the inverter-regulator. In an operating ratio the inverter-regulator supplied 12 amps during the transmit mode, 5 amps during the receive mode and .5 amp during the standby mode. These currents must be supplied by the transistors 22 and 30 in the oscillator circuit 18. Assuming each of these transistors has a beta of 10, 1.2 amps would have to be applied, via the feedback windings 34 and 36, to the bases of transistors 22 and 30 in order to provide 12 amps during the transmit mode. To provide .5 amp during the standby mode, only .05 amp of feedback current would be necessary. However, the oscillator circuit 18 as described thus far, provides a fairly constant amplitude feedback voltage and, therefore, the feedback current is also constant so that even for a medium load occurring during the receive condition and for a low load occurring during the standby condition, the base bias or input current of the transistors 22 and 30 would remain at 1.2 amps. This causes the overall efficiency of the inverter-regulator (ratio of power supplied to the load 13 divided by the power supplied to the inverter-regulator by the battery 10) to be about 70% both in the transmit and receive modes and 4% in the standby mode. It is generally assumed that a two-way radio is operated 10% of the time in its receive condition, 10% of the time in its transmit condition, and 80% of the time in its standby condition so that the overall efficiency (excluding losses which may occur in the rectifier and regulator circuit 20) would be about 17%.

The automatic bias circuit 46 contained in the oscillator 18 serves to improve the overall efficiency by reducing the current supplied to the bases of the transistors 22 and 30 for lighter load conditions. The output current of the transistors flows through the sensing resistor 28 so that a control voltage is available at junction 48 indicative of the current. This control voltage is coupled through a voltage divider comprising resistors 50 and 52 to the base of a current sensing PNP transistor 54. The emitter of transistor 54 is coupled through resistor 56 to the positive terminal of the battery 10 to provide a quiescent bias voltage. The collector of transistor 54 is coupled through a resistor 58 to the base of an NPN transistor 60 which is biased by a resistor 64 and a thermistor 66. Resistor 68 and capacitor 70 connected in parallel from the collector of transistor 60 to the negative terminal of battery 10 act to remove AC components appearing on the collector.

The input current to the transistor 22 flows from the positive terminal of battery 10, through the emitter-base junction of transistor 22, the feedback winding 34, resistor 72, the collector-emitter junction of transistor 60, and resistor 62 back to the negative terminal of battery 10. A similar circuit may be traced for transistor 30 through its emitter-base junction and through feedback winding 36. Therefore, by controlling the collector-emitter impedance of transistor 60, simultaneous control of the input current to transistors 22 and 30 may be provided.

During the transmit mode, the current drawn by the transistors 22 and 30 is substantial and, therefore, the control voltage at junction 48 is somewhat less than the voltage supplied by the battery 10. Such control voltage will increase the conduction of transistor 54 which in turn will cause the collector-emitter resistance of transistor 60 to be quite low, preferably a short circuit, to provide maximum input current to the transistors 22 and 30. If the load current decreases, such as may occur during the receive mode, the current drawn through the collector-emitter junctions of transistors 22 and 30 would be reduced and the control voltage at junction 48 would increase. This reduces the conduction of transistor 54 to in turn increase the collector-emitter impedance of transistor 60 to provide less than a maximum input current to the transistors 22 and 30. When the value of load current decreases to its minimum value during the standby mode, the collector-emitter current of transistors 22 and 30 becomes a minimum, the control voltage at junction 48 becomes a maximum and the collector-emitter impedance of transistor 60 is rather high to reduce the input current to transistors 22 and 30 to a low value.

Because the automatic bias circuit 46 causes the input currents to the transistors 22 and 30 to be low for the low load condition, the efficiency of the inverter-regulator was improved from 4% to about 13%. The efficiency during the receive condition stayed approximately the same at about 70% because the sensing resistor 28 dissipated about the same magnitude of power as was saved by reducing the input current to the transistors 22 and 30. The efficiency during the transmit condition decreased from 70% to about 55% primarily due to the increased dissipation in the sensing resistor 28. However, because the radio is operated in the standby condition for 80% of the time whereas it is only operated in the receive and transmit conditions for 10% of the time each, the overall efficiency improved from 17% to 23%.

Figure 2:
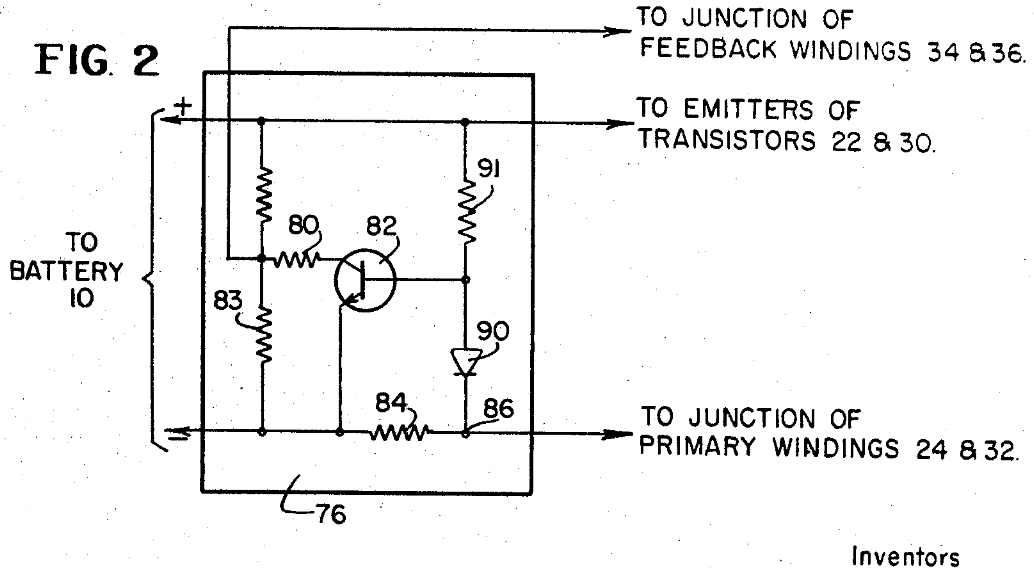
FIG. 2 illustrates another embodiment of the input current control circuit of the inverter of the invention.

Another form of the automatic bias circuit, labeled 76 is shown in FIG. 2 where the input current for the transistors 22 and 30 again flows through a variable resistance path. here comprising a low value resistor 80 coupled in series with the collector-emitter impedance of an NPN transistor 82. Additionally, a second path comprising a relatively high value resistor 83 is coupled in parallel with the first path from the negative terminal of the battery to the junction of the feedback windings 34 and 36. The output current in the transistors 22 and 30 flows through the sensing resistor 84 to provide a control voltage at junction 86 indicative of the magnitude of such output current. The control voltage is coupled to the base of transistor 82 by a diode 90. The base of transistor 82 is coupled through a resistor 91 to the positive terminal of the battery 10 to provide a quiescent base voltage.

During the low load standby condition, the output current for the transistors 22 and 30 is quite low so that there is almost no voltage drop across the sensing resistor 84 and base-emitter voltage of transistor 82 will be equal to the quiescent base voltage from the positive terminal of battery 10 through resistor 91. The degree of conduction of transistor 82 will be relatively low and its collector-emitter resistance will be relatively high to cause the input current to the transistors 22 and 30 to flow almost entirely through resistor 83 so that such input current is a minimum.

During the heavy load transmit condition, the voltage drop across resistor 84 will increase substantially to provide an increased voltage at junction 86 to provide an increased voltage on the base of transistor 82 relative to its emitter to add to the quiescent voltage from the positive terminal of battery 10 through resistor 91. This increases the conduction of the transistor and reduces its collector-emitter resistance so that the input current to the transistors 22 and 30 flows primarily through the path consisting of resistor 80 and the collector-emitter resistance of transistor 82 to provide the necessary high value input current to the transistors 22 and 30.

What has been described, therefore, is an improved oscillator circuit especially adapted for use in an inverter-regulator circuit, the efficiency of which is substantially improved over a wide range of load values.

We claim:

1. An oscillator circuit for providing an alternating current in a load from direct current supply means, and wherein load currents of different magnitudes are required, such oscillator including in combination; an electron control device having input, output and common electrodes, a load circuit including said common output electrodes coupling the direct current voltage supply means to the load, feedback means coupled to the load and to said input electrode and cooperating with said electron control device for developing alternating current in the load, variable resistance means coupling the direct current voltage supply means in series with said input and common electrodes to provide input current for said electron control device, said load circuit including a sensing device coupled in series with the load to provide a control voltage indicative of the current flowing therethrough, and circuit means coupled between said sensing device and said variable resistance means for controlling the resistance thereof and changing the input current in said electron control device in the same direction as changes in the magnitude of current flowing through the load.

2. The oscillator circuit set forth in claim 1, wherein said variable resistance means comprises a further electron control device having a pair of output electrodes coupling the direct current voltage in series with said input and common electrodes of said electron control device, and wherein said further electron control device has an input electrode coupled to said circuit means.

3. The oscillator circuit set forth in claim 2, wherein said sensing device means comprises further resistance means, wherein said circuit means comprises an additional electron control device having a pair of input electrodes direct current coupled across said further resistance means, and wherein said additional electron control device has an output electrode direct current coupled to said input electrode of said further electron control device.

4. The oscillator circuit set forth in claim 2, wherein said sensing device comprises further resistance means, and wherein said circuit means comprises a diode coupled from said further resistance means to said input electrode of said further electron control device to couple the control voltage thereto.

5. The oscillator circuit set forth in claim 1, wherein the load includes a first winding, and wherein said feedback means includes a second winding inductively coupled to said first winding and poled with respect thereto to regeneratively couple an alternating current to said input electrode.

6. The oscillator circuit set forth in claim 5, wherein said variable resistance means includes a further electron control device having a pair of output electrodes and an input electrode, and means coupling said second winding, said pair of output electrodes, and the direct current voltage in series with said input and common electrodes of said electron control device.

7. In an oscillator circuit to develop a pulsating signal in a load impedance the magnitude of the current through which is subject to change, the oscillator circuit having first and second electron control devices each with input, output and common electrodes, a saturating transformer having a pair of series coupled primary winding individually coupled to the output electrodes of the said electron control devices, the transformer having a pair of series coupled feedback windings individually coupled to the input electrodes of the devices, the saturating transformer having a secondary winding coupled to the load impedance, said feedback windings being poled with respect to said primary windings to produce the pulsating signal across said secondary winding, a direct current voltage supply coupled between the common electrode of the electron control devices and the junction of the primary windings, an automatic bias circuit coupled between the common electrode of the electron control devices and the junction of the feedback windings, the automatic bias circuit including in combination; variable resistance means coupling the direct current voltage supply in series with the input and common electrodes of the electron control devices and their associated feedback windings to provide input current for the devices, a sensing device coupled in series with each of the primary windings to provide a control voltage indicative of the current flowing through the load impedance, and circuit means coupled between said sensing device and said variable resistance means for controlling the resistance thereof and changing the input current in the electron conrol devices in the same direction as changes in the magnitude of the current flowing through the load impedance.

8. The oscillator circuit set forth in claim 7, wherein said variable resistance means includes a control transistor having emitter and collector electrodes coupled in series with the direct current voltage supply, the common and input electrodes of the electron control devices and their associated feedback windings, wherein said transistor has a collector-emitter resistance, and wherein said transistor has a base electrode coupled to said circuit means for controlling the value of said collector-emitter resistance inversely with changes in the magnitude of current flowing through the load impedance.

9. The oscillator circuit set forth in claim 8, wherein said circuit means includes; a further transistor having emitter, base and collector electrodes, means coupling said base electrode of said further transistor to said sensing device, means coupling the direct current voltage supply to said emitter electrode of said further transistor to provide a quiescent voltage thereon, and means coupling said collector electrode of said further transistor to the base electrode of said control transistor.

10. The oscillator circuit set forth in claim 8, wherein said automatic bias circuit further includes fixed resistance means coupled in parallel with the collector-emitter resistance of said control transistor for coupling greater portions of the input current to the electron control devices as the magnitude of current in the load impedance increases.

11. The oscillator circuit set forth in claim 8, wherein said circuit means comprises a diode coupled from said sensing device to said base electrode of said control transistor to couple the control voltage thereto.

12. The oscillator set forth in claim 11, wherein said automatic bias circuit further includes resistance means coupled from the direct current voltage supply to the base electrode to provide a quiescent bias voltage thereon which is changer by the control voltage coupled through said diode.

References Cited

UNITED STATES PATENTS 3,412,311 11/1968 Siedband ............ 331—113

JOHN KOMINSKI, Primary Examiner

U.S. Cl. X.R.

321—18; 325—492; 331—186